United States Patent
Inoue et al.

(10) Patent No.: US 11,862,474 B2
(45) Date of Patent: Jan. 2, 2024

(54) SUBSTRATE PROCESSING APPARATUS AND SUBSTRATE PROCESSING METHOD

(71) Applicant: Tokyo Electron Limited, Tokyo (JP)

(72) Inventors: Taisei Inoue, Koshi (JP); Hiroki Sakurai, Koshi (JP); Takashi Nakazawa, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 17/104,086

(22) Filed: Nov. 25, 2020

(65) Prior Publication Data
US 2021/0175093 A1    Jun. 10, 2021

(30) Foreign Application Priority Data

Dec. 4, 2019 (JP) .................................. 2019-219842

(51) Int. Cl.
*H01L 21/3213* (2006.01)
*C23F 1/30* (2006.01)
*H01L 21/67* (2006.01)

(52) U.S. Cl.
CPC .......... *H01L 21/32134* (2013.01); *C23F 1/30* (2013.01); *H01L 21/6715* (2013.01); *H01L 21/67248* (2013.01); *H01L 21/67253* (2013.01)

(58) Field of Classification Search
CPC ........... H01L 21/32134; H01L 21/6715; H01L 21/67248; H01L 21/67253; C23F 1/30
See application file for complete search history.

(56) References Cited

U.S. PATENT DOCUMENTS

| | | | |
|---|---|---|---|
| 2007/0257011 A1* | 11/2007 | Siefering | .......... H01L 21/67086 216/99 |
| 2019/0301026 A1* | 10/2019 | Kouno | .............. H01L 21/32134 |
| 2021/0391188 A1* | 12/2021 | Inoue | ..................... H01L 21/306 |

FOREIGN PATENT DOCUMENTS

| | | | |
|---|---|---|---|
| JP | S57-097627 | A | 6/1982 |
| JP | H11-186215 | A | 7/1999 |
| JP | 2003-234307 | A | 8/2003 |
| JP | 2008-285508 | A | 11/2008 |
| JP | 2015-153989 | A | 8/2015 |

* cited by examiner

*Primary Examiner* — Binh X Tran
(74) *Attorney, Agent, or Firm* — Pearne & Gordon LLP

(57) ABSTRACT

A substrate processing apparatus includes a temperature detector, a calculation unit and an execution unit. The temperature detector is configured to detect a temperature of a substrate on which a processing liquid is discharged. The calculation unit is configured to calculate, by using a given calculation formula, an etching amount of the substrate based on the temperature detected by the temperature detector. The execution unit configured to perform an etching processing on the substrate by the processing liquid based on the etching amount.

6 Claims, 7 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-219842 filed on Dec. 4, 2019, the entire disclosure of which is incorporated herein by reference.

TECHNICAL FIELD

The various aspects and embodiments described herein pertain generally to a substrate processing apparatus and a substrate processing method.

BACKGROUND

Patent Document 1 describes a technique of etching titanium nitride without corroding a wiring material used in a semiconductor substrate.
Patent Document 1: Japanese Patent Laid-open Publication No. 2008-285508

SUMMARY

In one exemplary embodiment, a substrate processing apparatus includes a temperature detector, a calculation unit and an execution unit. The temperature detector is configured to detect a temperature of a substrate on which a processing liquid is discharged. The calculation unit is configured to calculate, by using a given calculation formula, an etching amount of the substrate based on the temperature detected by the temperature detector. The execution unit configured to perform an etching processing on the substrate by the processing liquid based on the etching amount.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
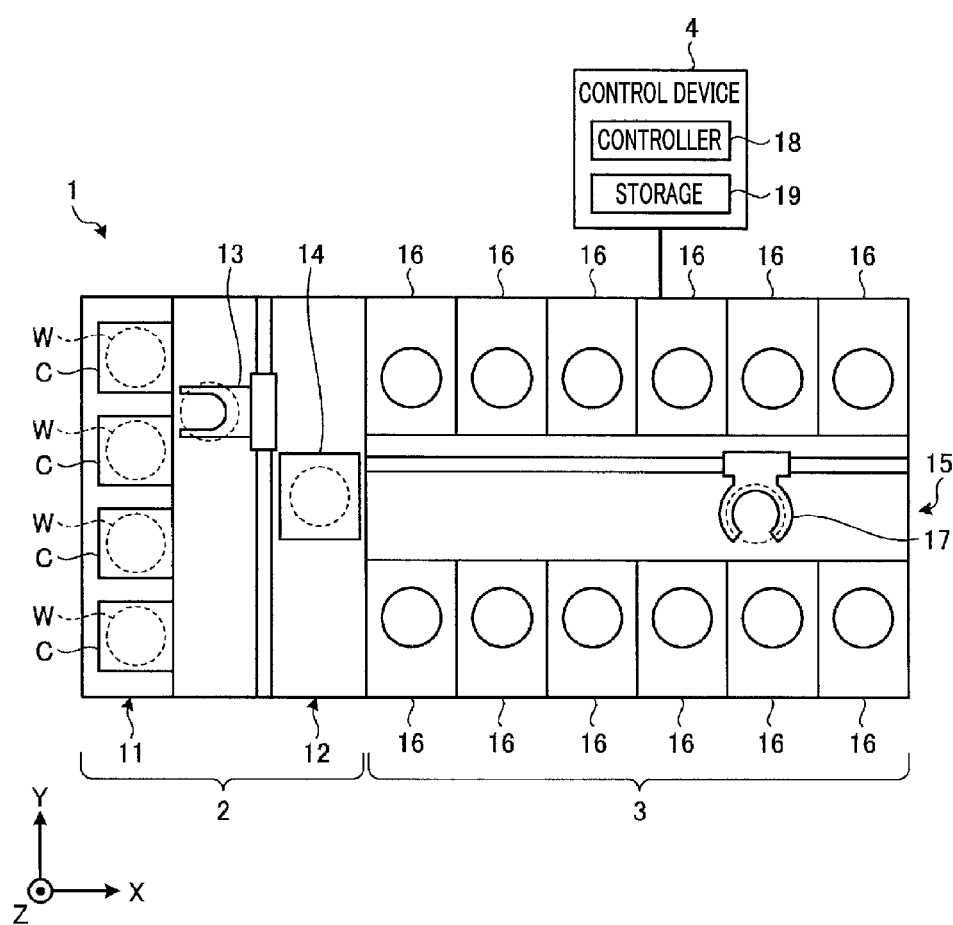
FIG. 1 is a diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a substrate processing method according to the present disclosure will be described in detail with reference to the accompanying drawings. The substrate processing apparatus and the substrate processing method of the present disclosure are not limited to the exemplary embodiments to be described below. Further, it should be noted that the drawings are schematic and relations in sizes of individual components and ratios of the individual components may sometimes be different from actual values. Even between the drawings, there may exist parts having different dimensional relationships or different ratios.

<Outline of Substrate Processing System>

FIG. 1 is a diagram illustrating a schematic configuration of a substrate processing system 1 (an example of a substrate processing apparatus) according to an exemplary embodiment. In the following, in order to clarify positional relationships, the X-axis, Y-axis and Z-axis which are orthogonal to each other will be defined, and the positive Z-axis direction will be regarded as a vertically upward direction.

The substrate processing system 1 includes a carry-in/out station 2 and a processing station 3. The carry-in/out station 2 and the processing station 3 are provided adjacent to each other. The substrate processing system 1 is configured to perform an etching processing on a semiconductor wafer W (hereinafter, simply referred to as "wafer W").

Films formed on the wafer W (an example of a substrate) on which the etching processing is to be performed are titanium nitride and tungsten. Further, a processing liquid for the etching processing is dilute sulfuric acid prepared by diluting sulfuric acid with pure water, for example, DIW (DeIonized Water). The dilute sulfuric acid has a predetermined concentration in which a ratio between the sulfuric acid and the pure water ranges from 1:1 to 20:1. Further, the processing liquid may be SPM (an aqueous solution of sulfuric acid and hydrogen peroxide).

The carry-in/out station 2 is provided with a carrier placing section 11 and a transfer section 12. In the carrier placing section 11, a plurality of carriers C is placed to accommodate a plurality of substrates (semiconductor wafers W (hereinafter, referred to as "wafers W") in the present exemplary embodiment) horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19. Details of the control device 4 will be elaborated later.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magneto optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

<Configuration of Processing Unit>

Figure 2:
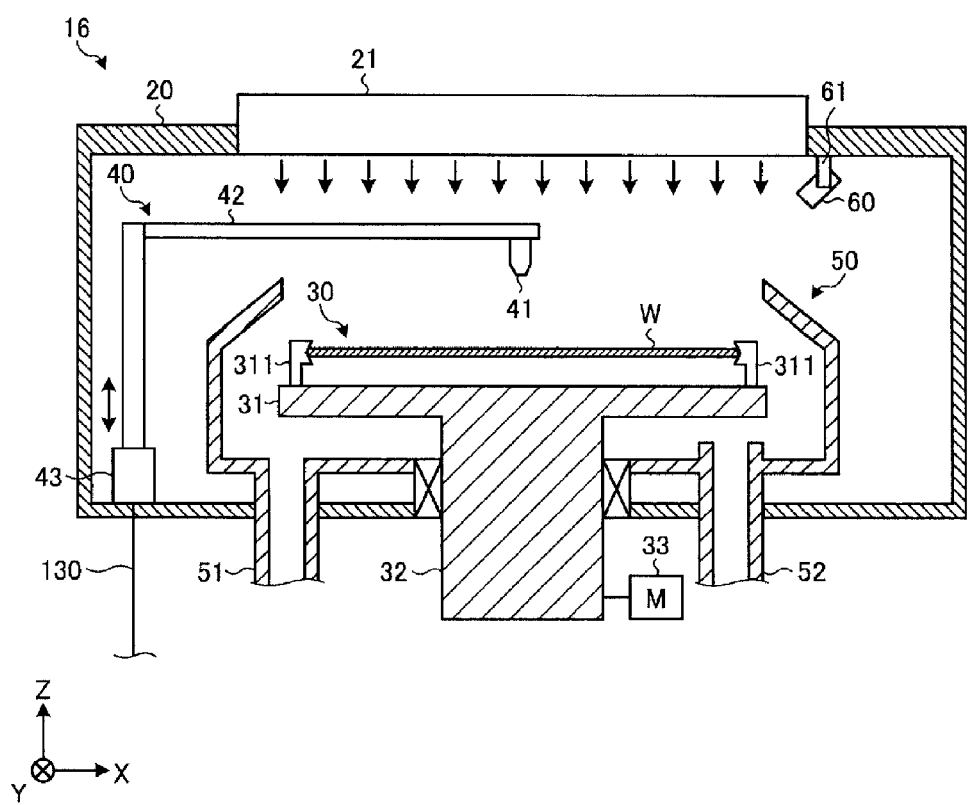
FIG. 2 is a schematic diagram illustrating a specific configuration example of a processing unit according to the exemplary embodiment.

Now, a configuration of the processing unit 16 will be described with reference to FIG. 2. FIG. 2 is a schematic diagram illustrating a specific configuration example of the processing unit 16 according to the exemplary embodiment. As depicted in FIG. 2, the processing unit 16 includes a chamber 20, a substrate processing unit 30, a liquid supply 40, a recovery cup 50, and a temperature sensor 60.

The chamber 20 accommodates therein the substrate processing unit 30, the liquid supply 40, and the recovery cup 50. A FFU (Fan Filter Unit) 21 is provided at a ceiling of the chamber 20. The FFU 21 creates a downflow within the chamber 20.

The substrate processing unit 30 is equipped with a holder 31, a supporting column 32, and a driver 33, and configured to perform a liquid processing on the wafer W placed thereon. The holder 31 is configured to hold the wafer W horizontally. The supporting column 32 is a vertically extending member. A base end of the supporting column 32 is rotatably supported by the driver 33, and the supporting column 32 supports the holder 31 horizontally at a leading end thereof. The driver 33 is configured to rotate the supporting column 32 around a vertical axis.

In the substrate processing unit 30, by rotating the supporting column 32 with the driver 33, the holder 31 supported by the supporting column 32 is rotated, so that the wafer W held by the holder 31 is rotated.

A holding member 311 configured to hold the wafer W from the lateral side thereof is provided at a top surface of the holder 31 of the substrate processing unit 30. The wafer W is horizontally held by this holding member 311 while being slightly spaced apart from the top surface of the holder 31. Further, the wafer W is held by the holder 31 with a front surface thereof to be subjected to a substrate processing facing upwards.

The liquid supply 40 is configured to supply a processing liquid onto the wafer W. The liquid supply 40 is equipped with a nozzle 41, an arm 42 configured to support the nozzle 41 horizontally, and a rotating/elevating mechanism 43 configured to rotate and move the arm 42 up and down.

The nozzle 41 is connected to a discharge line 130. The nozzle 41 is configured to discharge the processing liquid supplied through the discharge line 130. A pipeline configuration of the substrate processing system 1 including this discharge line 130 will be elaborated later.

Further, though the present exemplary is described for an example where the single nozzle 41 is provided in the processing unit 16, the number of the nozzle provided in the processing unit 16 is not limited to one. Further, though the present exemplary is described for an example where the nozzle 41 is disposed above (at a side of a front surface of) the wafer W in the processing unit 16, the nozzle may be disposed under (at a side of a rear surface of) the wafer W.

The recovery cup 50 is disposed to surround the holder 31, and collects the processing liquid scattered from the wafer W by the rotation of the holder 31. A drain port 51 is formed at a bottom of the recovery cup 50, and the processing liquid collected by the recovery cup 50 is drained from the drain port 51 to the outside of the processing unit 16. Further, an exhaust port 52 is formed at the bottom of the recovery cup 50 to exhaust a gas supplied from the FFU 21 to the outside of the processing unit 16.

The temperature sensor 60 (an example of a temperature detector) is configured to detect a temperature of the wafer W (an example of a substrate) onto which the processing liquid is discharged. To elaborate, the temperature sensor 60 is configured to measure a surface temperature of the wafer W. The temperature sensor 60 may be, by way of example, but not imitation, a radiation thermometer. The temperature sensor 60 is mounted to the chamber 20 with a mounting member 61 therebetween. The temperature sensor 60 measures a temperature of a preset position of the wafer W. The preset position is a previously set position and may be, for example, a center of the wafer W. The temperature sensor 60 may be fixed to the arm 42. Further, the temperature sensor 60 may be fixed to an arm different from the arm 42.

<Pipeline Configuration of Substrate Processing System>

Figure 3:
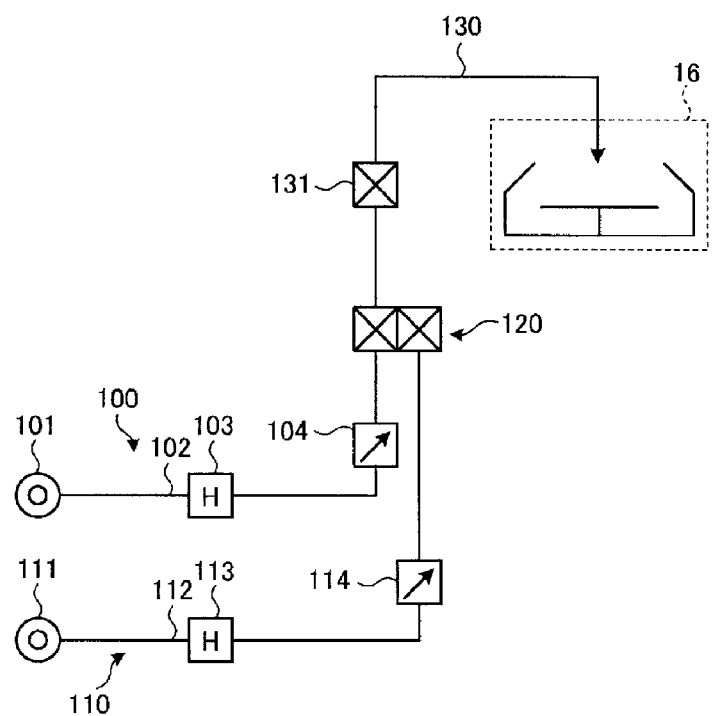
FIG. 3 is a schematic diagram illustrating a pipeline configuration of the substrate processing system according to the exemplary embodiment.

Now, a pipeline configuration of the substrate processing system 1 connected to the processing unit 16 will be explained with reference to FIG. 3. FIG. 3 is a schematic diagram illustrating the pipeline configuration of the substrate processing system 1 according to the exemplary embodiment.

Here, the pipeline configuration for supplying the processing liquid will be explained. Besides this pipeline system for the processing liquid, the processing unit 16 is equipped with, by way of example, a pipeline configuration and a nozzle for supplying DIW onto the wafer W in a rinsing processing and a pipeline configuration and a nozzle for supplying IPA onto the wafer W in a drying processing.

In the substrate processing system 1, dilute sulfuric acid produced by a joint unit 120 is supplied into the processing unit 16 through the discharge line 130. Sulfuric acid from a chemical liquid supply 100 and DIW from a DIW supply 110 are supplied into the joint unit 120. In the joint unit 120, the sulfuric acid and the DIW are mixed, so that the dilute sulfuric acid is produced.

The chemical liquid supply 100 is configured to supply the sulfuric acid to the joint unit 120. The chemical liquid supply 100 is equipped with a chemical liquid source 101, a supply line 102, a heater 103, and a flow rate controller 104. The sulfuric acid supplied into the supply line 102 from the chemical liquid source 101 is heated by a heater 103 to a first preset temperature. A flow rate of the sulfuric acid heated to the first preset temperature is adjusted by the flow rate controller 104. The first preset temperature is a previously set temperature which allows a temperature of the processing liquid to become equal to or higher than 50° C., and is set to be equal to or lower than a boiling point of the processing liquid.

The DIW supply 110 is configured to supply the DIW to the joint unit 120. The DIW supply 110 is equipped with a DIW source 111, a supply line 112, a heater 113, and a flow rate controller 114. The DIW supplied into the supply line 112 from the DIW source 111 is heated by a heater 113 to a second preset temperature. A flow rate of the DIW heated to the second preset temperature is adjusted by the flow rate controller 114. The second preset temperature is a previously set temperature which allows the temperature of the processing liquid to become equal to or higher than 50° C., and is set to be equal to or lower than the boiling point of the processing liquid.

In the substrate processing system 1, by using the flow rate controllers 104 and 114, a concentration of the processing liquid produced in the joint unit 120 is adjusted to a preset concentration. The discharge line 130 is provided with a valve 131. If the valve 131 is opened, the processing liquid adjusted to have the preset concentration is supplied to the wafer W. If the valve 131 is closed, the processing liquid is not supplied to the wafer W. The valve 131 is opened/closed by a motor (not shown) or the like.

Further, in the substrate processing system 1, by stopping the flow of the sulfuric acid in the flow rate controller 104 provided in the supply line 102, the DIW may be supplied to the wafer W via the discharge line 130.

<Details of Control Device>

Figure 4:
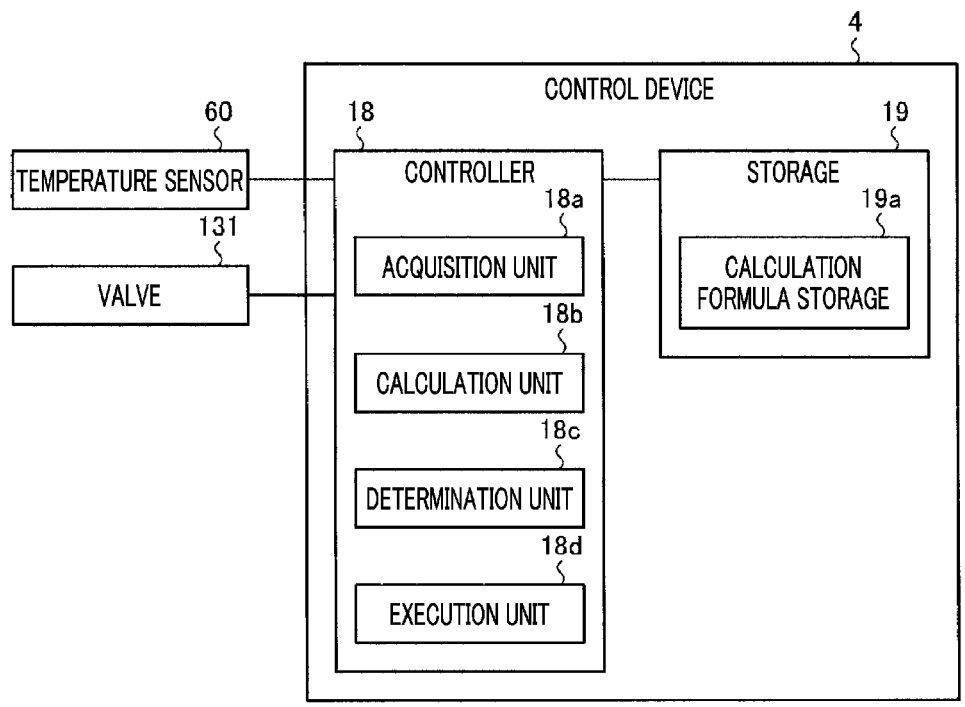
FIG. 4 is a block diagram illustrating a schematic configuration of a control device according to the exemplary embodiment.

Now, details of the control device 4 which controls the substrate processing system 1 will be explained with reference to FIG. 4. FIG. 4 is a block diagram illustrating a schematic configuration of the control device 4 according to the exemplary embodiment. As stated above, the control device 4 includes the controller 18 and the storage 19.

The storage 19 may be configured by, for example, a semiconductor memory device such as a RAM (Random Access Memory) or a flash memory, or a storage device such as a hard disk or an optical disk. The storage 19 has a calculation formula storage 19a.

The calculation formula storage 19a stores s calculation formula for calculating an etching amount D in an etching processing. The etching amount D can be calculated from a processing time (t1−t0) in the etching processing and an etching rate k by using the expression (1).

$$D=k \times (t1-t0) \qquad (1)$$

Here, "t1" denotes a supply time of the processing liquid, and "t0" represents a time when the wafer W reaches a target temperature at which the etching is begun. That is, the processing time is a time after the wafer W reaches the target temperature. The target temperature is equal to or higher than 50° C. and equal to or lower than the boiling point of the processing liquid.

Further, the etching rate k can be calculated, by using the expression (2), from an average wafer temperature Tave after the wafer W reaches the target temperature.

$$k=a \times \exp(b \times T\text{ave}) \qquad (2)$$

If "k" of the expression (2) is put in the place of "k" of the expression (1), the following expression (3) is obtained.

$$D=(a \times \exp(b \times T\text{ave})) \times (t1-t0) \qquad (3)$$

Here, "a" and "b" are exponential approximation fitting values. Further, "a" and "b" are calculated by using actual preliminary evaluation data. The preliminary evaluation data refers to data in which an etching processing is performed while varying a temperature of sulfuric acid and a concentration of sulfuric acid and a wafer temperature and an etching amount D' are obtained under respective conditions.

Further, a wafer W used to obtain the preliminary evaluation data is the same as the wafer W on which the etching processing is performed in the substrate processing system 1. A measurement point of the temperatures of the wafer W in the preliminary evaluation data is the same as the measurement point of the temperatures detected by the temperature sensor 60 when the etching processing is performed in the substrate processing system 1.

First, a time average wafer temperature Tave' in each condition is calculated from the etching processing time and the temperature of the wafer W. Further, an etching rate k' in each condition is obtained from the etching processing time and the etching amount D'.

Figure 5:
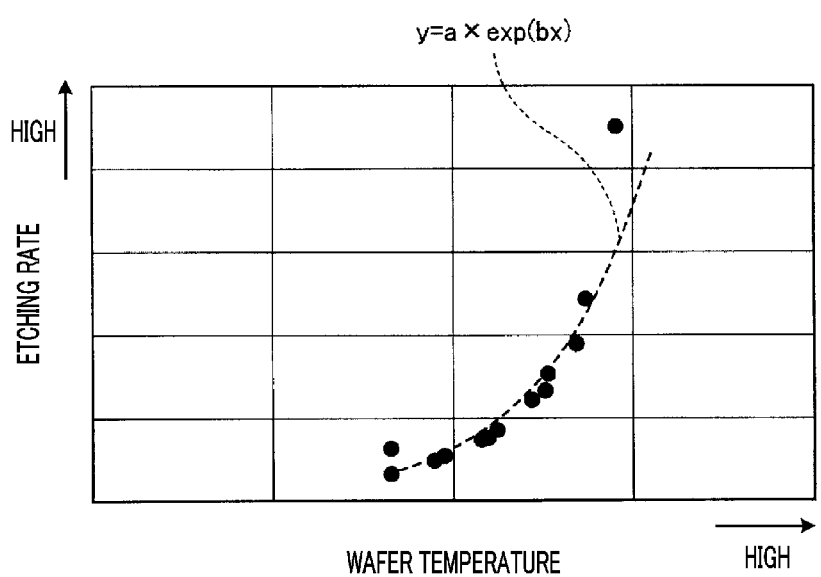
FIG. 5 is a diagram illustrating an exponential curve according to the exemplary embodiment.

Then, a graph in which the time average wafer temperature Tave' in each condition and the etching rate k' in each condition are plotted is created as shown in FIG. 5, and is approximated by an exponential curve. FIG. 5 is a diagram showing an exponential curve according to the exemplary embodiment. The aforementioned "a" and "b" are calculated and set based on the approximated exponential curve.

As stated above, the calculation formula of the expression (3) (an example of a given calculation formula) is a formula of an exponential function of the temperature of the wafer W and the processing time in the etching processing. The calculation formula storage 19a stores the calculation formula represented by the expression (3). Further, the calculation formula storage 19a stores the calculation formula for each etching processing condition, for example, the calculation formula according to the kind of the wafer W on which the etching processing is performed.

Referring back to FIG. 4, the controller 18 may be implemented by a CPU (Central Processing Unit) or MPU (Micro Processing Unit) or the like which executes the various programs stored in the storage 19 by using a RAM as a working area. Further, the controller 18 may be implemented by an integrated circuit such as, but not limited to, ASIC (Application Specific Integrated Circuit) or a FPGA (Field Programmable Gate Array).

The controller 18 includes an acquisition unit 18a, a calculation unit 18b, a determination unit 18c and an execution unit 18d, and implements or carries out a function and an operation of a control processing to be described below. Further, the internal configuration of the controller 18 is not limited to the example shown in FIG. 4, and the controller 18 may have various other configurations as long as it is capable of carrying out the following control processing.

The acquisition unit 18a is configured to acquire the information regarding the temperature of the wafer W (hereinafter, referred to as "wafer temperature") detected by the temperature sensor 60. The calculation unit 18b is configured to calculate the etching amount D from the acquired wafer temperature by using the calculation formula stored in the calculation formula storage 19a. That is, by using the calculation formula (an example of a given calculation formula), the calculation unit 18b calculates the etching amount D of the wafer W (an example of a substrate) based on the wafer temperature (an example of a temperature) detected by the temperature sensor 60 (an example of a temperature detector).

The determination unit 18c is configured to determine whether or not to end the etching processing. To elaborate, the determination unit 18c makes a determination upon whether the calculated etching amount D has reached a preset amount. The preset amount is a previously set value, and is an etching amount required for the wafer W.

The execution unit 18d is configured to perform the etching processing upon the wafer W (an example of the substrate) by the processing liquid based on the etching amount D. The execution unit 18d controls the supply of the processing liquid upon the wafer W, thus allowing the etching processing to be performed on the wafer W. The execution unit 18d controls a motor or the like, and performs the opening/closing of the valve 131.

To elaborate, to start the etching processing, the execution unit 18d opens the valve 131, thus beginning the supply of the processing liquid onto the wafer W. Further, if it is determined that the etching amount D has reached the preset amount, the execution unit 18d closes the valve 131, stopping the supply of the processing liquid upon the wafer W. That is, if the etching amount D reaches the preset amount (given amount), the execution unit 18d ends the discharge of the processing liquid.

Here, the function of the control device 4 of performing the discharge control of the processing liquid in the etching processing has been described. However, the control device 4 also performs, besides this discharge control, sulfuric acid temperature adjustment by the heater 103 and DIW temperature adjustment by the heater 113. Furthermore, the control device 4 performs a rinsing processing and a drying processing as well as the etching processing.

As stated above, the control device 4 calculates the etching amount D based on the wafer temperature by using the calculation formula, and ends the etching processing if the etching amount D reaches the preset amount. Thus, even if there is caused non-uniformity during the etching due to a non-uniform wafer temperature, the etching amount D can be made to reach the preset amount.

<Specific Example of Control Processing>

Figure 6:
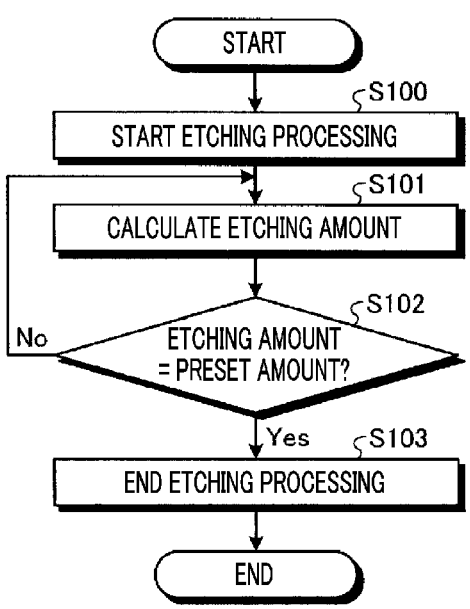
FIG. 6 is a flowchart illustrating a control processing according to the exemplary embodiment.

Now, a control processing according to the exemplary embodiment will be explained with reference to FIG. 6. FIG. 6 is a flowchart illustrating the control processing according to the exemplary embodiment.

The control device 4 begins the etching processing (S100). To elaborate, the control device 4 opens the valve 131, thus allowing the processing liquid to be supplied to the wafer W.

The control device 4 calculates the etching amount D (S101). To elaborate, the control device 4 acquires the wafer temperature from the temperature sensor 60, and calculates the etching amount D based on the acquired wafer temperature by using the calculation formula.

The control device 4 determines whether the calculated etching amount D has reached the preset amount (S102). If the etching amount D has reached the preset amount (S102: Yes), the control device 4 ends the etching processing (S103). Specifically, the control device 4 closes the valve 131, thus stopping the discharge of the processing liquid onto the wafer W.

If the calculated etching amount D is smaller than the preset amount (S102: No), the control device 4 carries on the calculation of the etching amount D (S101).

Figure 7A:
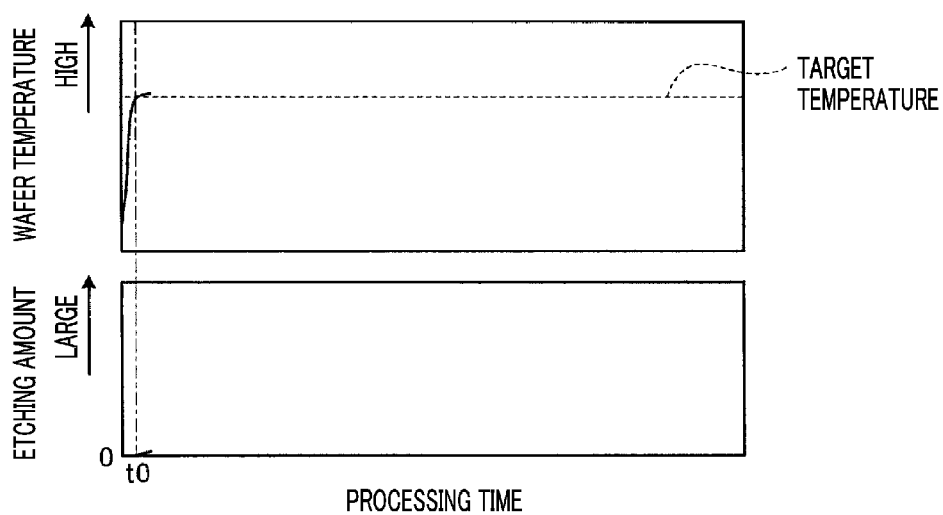
FIG. 7A is a first diagram showing a wafer temperature and an etching amount in the control processing according to the exemplary embodiment.
Figure 7B:
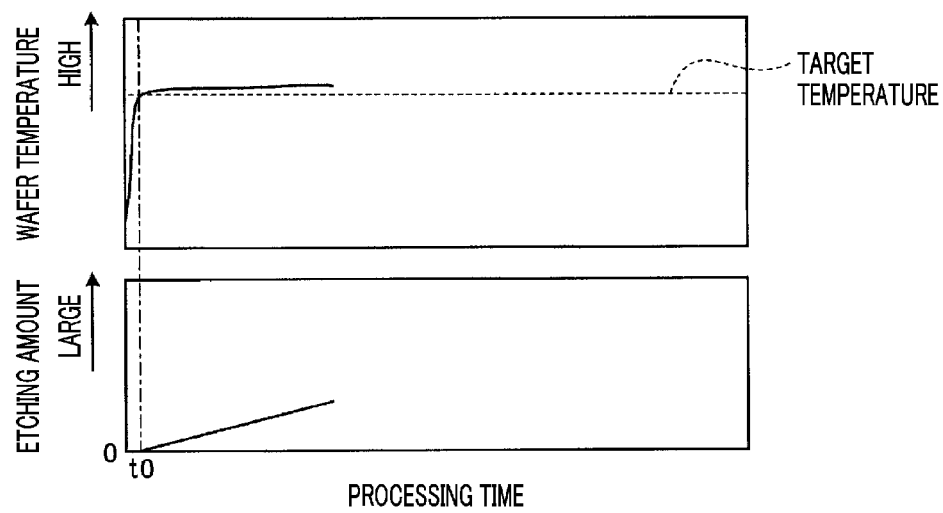
FIG. 7B is a second diagram showing the wafer temperature and the etching amount in the control processing according to the exemplary embodiment.
Figure 7C:
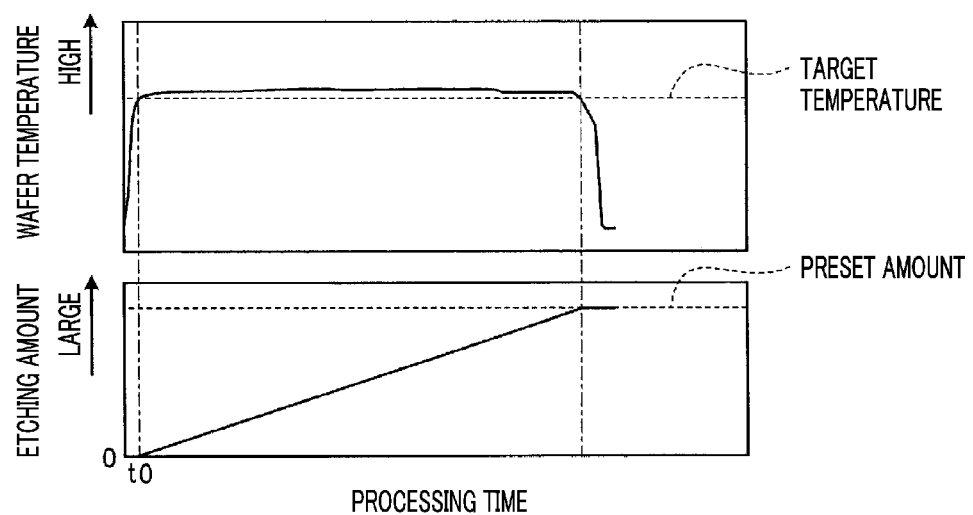
FIG. 7C is a third diagram showing the wafer temperature and the etching amount in the control processing according to the exemplary embodiment.

Now, the wafer temperature and the etching amount D in the above-stated control processing will be described with reference to FIG. 7A to FIG. 7C. FIG. 7A is a first diagram showing the wafer temperature and the etching amount D in the control processing according to the exemplary embodiment. FIG. 7B is a second diagram showing the wafer temperature and the etching amount D in the control processing according to the exemplary embodiment. FIG. 7C is a third diagram showing the wafer temperature and the etching amount D in the control processing according to the exemplary embodiment.

If the supply of the processing liquid upon the wafer W is begun (FIG. 7A), the temperature of the wafer W increases. If the temperature of the wafer W becomes equal to or higher than a target temperature at a time t0, the etching upon the wafer W by the processing liquid is begun, so that the etching amount D increases. Further, the etching amount D is calculated based on the aforementioned expression (3).

As the supply of the processing liquid upon the wafer W is continued and the temperature of the wafer W is maintained equal to or higher than the target temperature, the etching progresses, so that the etching amount D increases (FIG. 7B).

If the calculated etching amount D reaches the preset amount (FIG. 7C), the supply of the processing liquid upon the wafer W is stopped. Then, the temperature of the wafer W falls below the target temperature, so that the etching upon the wafer W is ended.

Effects

The substrate processing system 1 (an example of a substrate processing apparatus) includes the temperature sensor 60 (an example of a temperature detector), the calculation unit 18b and the execution unit 18d. The temperature sensor 60 detects the temperature of the wafer W (an example of a substrate) onto which the processing liquid is discharged. The calculation unit 18d calculates, by using the calculation formula (given calculation formula), the etching amount D of the wafer W based on the temperature detected by the temperature sensor 60. The execution unit

18d performs the etching processing upon the wafer W by the processing liquid based on the etching amount D.

Accordingly, the substrate processing system 1 is capable of calculating the etching amount D based on the temperature of the wafer W and carrying out the etching processing based on the etching amount D. The substrate processing system 1 performs the etching processing based on the etching amount D even if the temperature of the processing liquid varies due to a minute change in the supply flow rate of the sulfuric acid or the DIW. Therefore, the substrate processing system 1 is capable of etching the wafer W accurately.

Further, the execution unit 18d ends the supply of the processing liquid if the etching amount D reaches the preset value (an example of a given value).

Accordingly, the substrate processing system 1 is capable of allowing the etching amount D to reach the preset amount even if the non-uniformity is caused during the etching due to the non-uniform wafer temperature. Therefore, the substrate processing system 1 is capable of etching the wafer W accurately.

Furthermore, the calculation formula is a formula of the exponential function of the temperature and the processing time in the etching processing.

Thus, the substrate processing system 1 is capable of calculating the etching amount D accurately, and thus capable of etching the wafer W with high accuracy.

Further, the temperature sensor 60 detects the surface temperature of the wafer W.

Accordingly, the substrate processing system 1 is capable of calculating the etching amount D based on the temperature of the wafer W on which the etching processing is performed. Thus, the substrate processing apparatus 1 is capable of etching the wafer W accurately.

Further, the films formed on the wafer W on which the etching processing is performed are titanium nitride and tungsten.

The substrate processing system 1 is capable of accurately etching the wafer W on which the films of the titanium nitride and the tungsten are formed.

Further, the processing liquid is the dilute sulfuric acid prepared by diluting the sulfuric acid with the DIW (an example of pure water). Specifically, the processing liquid has the concentration in which the ratio between the sulfuric acid and the pure water ranges from 1:1 to 20:1. Further, the processing liquid has the temperature equal to or higher than 50° C. and equal to or lower than the boiling point of the processing liquid.

Accordingly, the substrate processing system 1 is capable of etching the titanium nitride while suppressing etching of the tungsten.

Modification Examples

The substrate processing system 1 may calculate the etching amount D by using a formula of an exponential function different from the calculation formula of the exponential function represented by the expression (3). The formula of the exponential function is calculated from a correlation between the temperature of the wafer W and the etching amount D' by using the preliminary evaluation data. By way of example, the substrate processing system 1 may calculate the etching amount D by using an Arrhenius equation represented by the following expression (4).

$$K/A = \exp(-E/RT) \quad (4)$$

"K" denotes a rate constant, and "A" is a frequency factor. Further, "E" indicates an activation energy; "R", a gas constant; "T", a temperature of the wafer W.

The etching amount D is proportional to a section integration of the processing time of "K/A". Thus, the etching amount D can be calculated by using the following expression (5).

$$D = a \times \int (K/A) dt \quad (5)$$

If the expression (4) is put in the expression (5), the etching amount D can be represented by the following expression (6).

$$D = a \times \int (\exp(-E/RT)) dt \quad (6)$$

Proportionality constants "a" and "E" are calculated and set by using the preliminary evaluation data. Specifically, based on the preliminary evaluation data, "a" is calculated from a gradient of an approximation straight line in a graph on which $(\int(\exp(-E/RT))dt)$ is plotted as a horizontal axis and the etching amount D' is plotted as a vertical axis. Further, a value of "E" is varied, and the value allowing the highest coefficient of determination is calculated as "E". The calculation formula of the expression (5) is stored in the calculation formula storage 19a.

The substrate processing system 1 may calculate the etching amount D by using the expression (5) stored in the calculation formula storage 19a.

Accordingly, the substrate processing system 1 is capable of etching the wafer W with high accuracy.

Further, the method of measuring the temperature of the wafer W is not limited to using the temperature sensor 60 as described above. By way of example, in the substrate processing system 1, a temperature sensor such as a thermocouple may be provided at a contact portion in contact with the wafer W.

Furthermore, the substrate processing system 1 may measure temperatures of the wafer W at multiple positions. By way of example, the substrate processing system 1 may measure a temperature of a central portion of the wafer W, a temperature of a peripheral portion of the wafer W, and a temperature of a portion between the central portion and the peripheral portion of the wafer W. In this case, for example, calculation formulas set for the temperatures of the wafer W at the multiple positions are stored in the calculation formula storage 19a. By way of example, the substrate processing system 1 calculates etching amounts D at the multiple positions of the wafer W and performs the etching processing based on the etching amounts D. Furthermore, the substrate processing system 1 may correct an etching amount D by estimating a difference between the multiple etching amounts D.

In addition, the substrate processing system 1 may supply the processing liquid onto the wafer W while rotating the arm 42. Further, the substrate processing system 1 may measure multiple temperatures of the wafer W by supplying the processing liquid onto the wafer W while rotating the arm 42.

Accordingly, the substrate processing system 1 is capable of etching the wafer W accurately. The substrate processing system 1 is capable of improving the uniformity of the etching amount D within the surface of the wafer W.

Moreover, based on the etching amount D, the substrate processing system 1 may calculate a time taken before the etching processing is finished, and may end the etching processing based on the calculated time.

The features of the substrate processing system 1 according to the exemplary embodiment and the modification examples may be applied in combinations.

So far, the exemplary embodiments have been described. However, it should be noted that the above-described exemplary embodiments are illustrative in all aspects and are not anyway limiting. The above-described exemplary embodiments may be omitted, replaced and modified in various ways without departing from the scope and the spirit of claims According to the present disclosure, it is possible to etch the substrate with high accuracy.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus, comprising:
a temperature detector configured to detect a temperature of a surface of a substrate on which a processing liquid is being discharged toward the surface of the substrate from a nozzle;
a calculation unit configured to calculate, by using a given calculation formula, an etching amount of the substrate based on the temperature of the surface of the substrate detected by the temperature detector; and
an execution unit configured to perform an etching processing on the substrate by the processing liquid based on the etching amount,
wherein the temperature detector is further configured to detect when the substrate reaches a target temperature, and
wherein the given calculation formula is a formula of an exponential function of the temperature and a processing time in the etching processing, the temperature being an average temperature of the surface of the substrate after the substrate reaches the target temperature, and the processing time being a difference value between a supply time of the processing liquid and a time when the substrate reaches the target temperature,
wherein the given calculation formula is $$D = (a \times \exp(b \times T\text{ave})) \times (t1 - t0)$$

wherein D is the etching amount, Tave is the average temperature, t1 is the supply time of the processing liquid, t0 is the time when the substrate reaches the target temperature, and a and b are exponential approximation fitting values.

2. The substrate processing apparatus of claim 1,
wherein the execution unit stops a discharge of the processing liquid when the etching amount reaches a preset value.

3. The substrate processing apparatus of claim 1,
wherein the execution unit is further configured to etch titanium nitride and tungsten films formed on the substrate by the processing liquid.

4. The substrate processing apparatus of claim 1,
wherein the processing liquid is dilute sulfuric acid prepared by diluting sulfuric acid with pure water.

5. The substrate processing apparatus of claim 4,
wherein the processing liquid has a concentration in which a volume ratio between the sulfuric acid and the pure water ranges from 1:1 to 20:1.

6. The substrate processing apparatus of claim 4,
wherein the processing liquid has a temperature equal to or higher than 50° C. and equal to or lower than a boiling point of the processing liquid.

* * * * *